United States Patent [19]

Kasahara

[11] Patent Number: 4,868,134
[45] Date of Patent: Sep. 19, 1989

[54] METHOD OF MAKING A VARIABLE-CAPACITANCE DIODE DEVICE

[75] Inventor: Takeshi Kasahara, Saitama, Japan

[73] Assignee: Toko, Inc., Japan

[21] Appl. No.: 233,064

[22] Filed: Aug. 17, 1988

[30] Foreign Application Priority Data

Aug. 31, 1987 [JP] Japan .................. 62-216785

[51] Int. Cl.$^4$ ........................................... H01L 29/93
[52] U.S. Cl. ..................................... 437/27; 437/904; 437/919; 437/933; 437/956; 148/DIG. 171; 357/14
[58] Field of Search ................ 437/27, 904, 919, 933, 437/956; 148/DIG. 171; 357/14

[56] References Cited

U.S. PATENT DOCUMENTS

| | | | |
|---|---|---|---|
| 3,581,164 | 5/1971 | Pfander | 357/14 |
| 3,764,415 | 10/1973 | Raabe et al. | 357/14 |
| 3,840,306 | 10/1974 | Raabe et al. | 357/14 |
| 3,897,276 | 7/1975 | Kondo | 437/20 |
| 4,475,117 | 10/1984 | Raabe | 357/14 |

FOREIGN PATENT DOCUMENTS

| | | | |
|---|---|---|---|
| 0069869 | 6/1981 | Japan | 357/14 |
| 0078174 | 6/1981 | Japan | 357/14 |
| 0081961 | 7/1981 | Japan | 357/14 |
| 0094673 | 7/1981 | Japan | 357/14 |

Primary Examiner—Brian E. Hearn
Assistant Examiner—T. Thomas

[57] ABSTRACT

A method of making a variable-capacitance diode device including semiconductor layer a first conductivity type in which the impurity concentration decreases with increasing depth from surface of a PN junction. The semiconductor layer of the first conductivity type is formed by diffusing an impurity element of the first conductivity type in a semiconductor substrate with a high degree of concentration. Thereafter, a semiconductor layer of a second conductivity type is formed which has such an impurity concentration profile that the concentration of impurity element of the second conductivity type is lower than the impurity concentration of said semiconductor layer of the first conductivity type formed in said semiconductor substrate and at a predetermined depth, the concentration of the second conductivity type impurity element is substantially equal or close to the concentration of the first conductivity type impurity element. Subsequent to the formation of the first conductivity type semiconductor layer, an impurity element of the second conductivity type is diffused so as to define said PN junction with said first conductivity type semiconductor layer.

5 Claims, 2 Drawing Sheets

METHOD OF MAKING A VARIABLE-CAPACITANCE DIODE DEVICE

BACKGROUND OF THE INVENTION

1. Field of the Invention

This invention relates to a method of manufacturing a variable-capacitance diode device which can be most effectively used as a tuning element, and more particularly it pertains to such a method in which the profile of impurity concentration of the diode device can easily be controlled depth-wise of the surface of the device.

2. Description of the Prior Art

Variable-capacitance diode devices have recently found extensive use as tuning elements for electronic tuning circuit. There have conventionally been demands for variable-capacitance diode devices with a wide voltage range. With a variable-capacitance diode device, as the potential difference across the junction thereof increases with a reverse bias voltage (referred to as applied voltage hereinafter), the width of depletion layer tends to expand with increasing impurity concentration in the semiconductor layer. To achieve a variable-capacitance diode device with a wide voltage range, it has been the usual practice that the impurity concentration in that region of the semiconductor layer where the depletion layer tends to expand, is controlled so as to be proximate to the Gaussian distribution, i.e., so as to decrease smoothly so that the expansion of the depletion layer increases gradually with the applied voltage. Recently, however, there have been demands for a variable-capacitance diode device which is designed such that a wide range of variation in the depletion layer width occurs with respect to the narrow range of variation in the applied voltage and sufficient tuning capacitance is available.

A conventional method of making a variable-capacitance diode device will now be described with reference to FIG. 1 wherein the abscissa represents the depth $X_i$ from the surface of the semiconductor substrate of the diode device, and the ordinate indicates the impurity concentration C on semi-logarithmic scale.

In FIG. 1, the dotted curve (10) represents the profile of impurity concentration of an N+ conductivity type semiconductor layer formed by means of an ion-implantation process. Formed in the N+ conductivity type semiconductor layer is a P+ conductivity type semiconductor layer also by means of an ion-implantation process, the profile of impurity concentration thereof being indicated by the solid curve (11). In this way, a PN junction J is defined between the N+ and P+ type semiconductor layers, and the variable-capacitance diode device is made. The profile of impurity concentration in the N+ conductivity type semiconductor layer as indicated by the curve (12) decreases smoothly except for the PN junction J, and it is usual that the concentration curve (12) represents a concentration profile in the form of Gaussian distribution which is proximate to the curve (10). In FIG. 1, the region indicated at (13) corresponds to an epitaxial layer, and the region shown at (14) corresponds to substrate.

However, it will be seen that the profile of impurity concentration in the N+ conductivity type semiconductor layer, except in the proximity to the PN junction J, is such that the following relationship holds:

$$A_i > A_{i+1}$$

on the assumption that the impurity concentration at the highest point of the curve is $A_1$, and those at sequential points are $A_2, A_3, \ldots, A_i, A_{i+1}, \ldots$, respectively. The profile of impurity concentration in the region $A_1$, $A_2$, $A_3$ appears approximate to the Gaussian distribution, and tends to swell out. Such swelling will be described with reference to FIG. 2 which illustrates the relationship between the applied voltage and the capacitance on semi-logarithmic scale.

As shown at (I) in FIG. 2, the relationship between the applied voltage and the capacitance varies along a curve resembling inverted S-shape corresponding to the profile of impurity concentration, instead of changing linearly from the maximum impurity concentration $C_{max}$ to the minimum impurity concentration $C_{min}$. Thus, when the voltage range over which the variable-capacitance diode device is usable as tuning element is wide, critical problems are relatively less likely to arise. In contrast thereto, when it is desired that a variable-capacitance diode device having a similar construction to that of the prior art be operated with an applied voltage as low as 1 or 2 V, i.e., when it is attempted to make use of tuning capacitance occurring over a narrow voltage range as shown at (II) in FIG. 2, there occurs such a disadvantage that sufficient capacitance variation is not available, and hence it is necessary to improve the characteristics of the variable-capacitance diode device.

SUMMARY OF THE INVENTION

The present invention has been made with a view to eliminating the above-mentioned problems with the prior art.

It is a primary object of this invention to provide a method of manufacturing an improved variable-capacitance diode device which is so designed that sufficient tuning capacitance is available even with a low voltage.

Another object of this invention is to provide a method of manufacturing a variable-capacitance diode device which is designed so that the capacitance is varied with applied voltage substantially linearly on logarithmic scale.

Still another object of this invention is to provide a method of manufacturing a variable-capacitance diode device having such a construction that the impurity concentration at a predetermined depth can be easily reduced.

The present invention relates to a method of manufacturing a variable-capacitance diode device which is usable as a tuning element with an electronic tuning circuit. The variable-capacitance diode device provided according to the method of this invention includes a semiconductor layer of a first conductivity type wherein a high impurity concentration decreases gradually as the depth from the PN junction increases. The profile of impurity concentration in the semiconductor layer of the first conductivity type is such that at least one point where the following relation holds, occurs in the semiconductor layer of the first conductivity type:

$$A_i \leq A_{i+1} \ (i=1, 2, \ldots, n)$$

on the assumption that the impurity concentration in terms of the distance $X_i$ depth-wise of the PN junction except in the vicinity of the PN junction is $A_i$. The method of this invention includes the steps of making the concentration of impurity element of a second conductivity type lower than the concentration of first conductivity type impurity element in the semiconductor substrate; and forming, at a predetermined depth, a diffusion layer of the second conductivity type having an impurity concentration profile which is substantially identical or close to the first conductivity type impurity concentration profile.

Other objects, features and advantages of the present invention will become apparent from the ensuing description taken in conjunction with the accompanying drawings.

DESCRIPTION OF THE PREFERRED EMBODIMENTS

Figure 3:
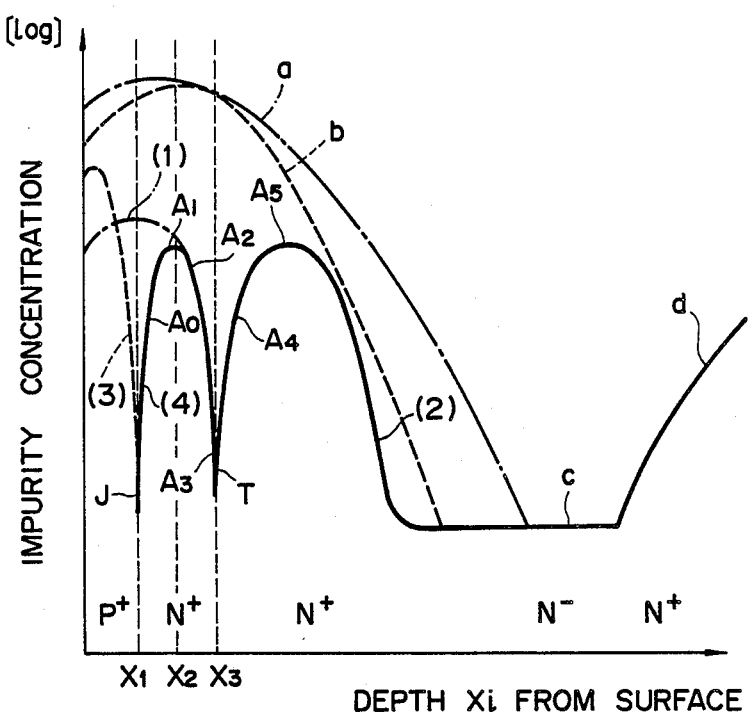
FIG. 3 illustrates an impurity concentration profile which results from the method of manufacturing a variable capacitance diode device according to an embodiment of this invention.

Referring to FIG. 3, there is illustrated the profile of impurity concentration of the variable-capacitance diode device manufactured by the method of an embodiment of this invention, wherein the abscissa indicates the depth $X_i$ from the surface of the semiconductor substrate, and the ordinate shows the impurity concentration C on a logarithmic scale.

According to the method of this invention which provides a variable-capacitance diode device having such an impurity concentration profile as illustrated in FIG. 3, a P+ conductivity type semiconductor layer in which impurity concentration is distributed as represented by the curve (3), is formed, by means of ion-implantation process or the like, in an N+ semiconductor layer in which the impurity concentration is distributed as shown by the curves (1) and (2). In this way, a PN junction is defined nearly at a depth $X_1$ from the surface of the semiconductor substrate, and a point where the donor concentration of the N+ semiconductor layer is reduced, i.e., an inflection point T is made to occur at a depth $X_3$ from the surface of the semiconductor substrate. The occurrence of the inflection point prevents the impurity concentration profile curve from swelling out so that the relationship between applied voltage and impurity concentration turns out to be substantially linear as represented at (II) in FIG. 4, instead of assuming such an inverted S-shape as shown at (I) in FIG. 4.

The capacitance C of the PN junction is related to the depletion layer width W and the area S of the PN junction as follows:

$$C = \epsilon S / W \quad (1)$$

where $\epsilon$ is the product of the relative dielectric constant of silicon and the dielectric constant of a vacuum, i.e., it is equal to $1.062 \times 10^{-8}$.

To decrease the capacitance C, on the other hand, it will be seen from Equation (1) that it is only necessary to increase the depletion layer width on the assumption that the area S of the PN junction is constant. Furthermore, the following equation holds true with respect to the depletion layer width:

$$W = K \left[ \frac{2\epsilon(V + \Phi)}{e} \left( \frac{1}{N_A} + \frac{1}{N_D} \right) \right]^{\frac{1}{2}}$$

where
K = Factor of proportionality
$N_A$ = Acceptor concentration
$N_D$ = Donor concentration
V = Applied voltage
$\Phi$ = Diffusion potential
e = Electron charge ($1.60 \times 10^{-19}$ C)

Since the acceptor concentration $N_A$ is much higher than the donor concentration $N_D$, i.e., $N_A << N_D$, the following equation holds:

$$W = K \left[ \frac{2\epsilon(V + \Phi)}{eN_D} \right]^{\frac{1}{2}} \quad (2)$$

Thus, to increase the depletion layer width W, it will be seen from Equation (2) that it is only necessary to decrease the donor concentration $N_D$ on the assumption that the applied voltage remains unchanged. In other words, it is only required that a region with a lower donor concentration be established in the N+ conductivity type semiconductor layer at the depth $X_i$ as measured from the surface of the semiconductor substrate.

The variable-capacitance diode device according to the present invention is fabricated on the basis of the foregoing concept. Description will now be made of the method embodying the present invention.

At a first step, a quantity of an N type conductivity type impurity element is ion-implanted and then diffused in an N− conductivity type semiconductor substrate provided with a mask of a predetermined pattern, thereby forming an N+ conductivity type semiconductor layer in which the impurity concentration becomes maximum at the depth $X_1$, as represented by the curve (a) in FIG. 3. This ion-implantation is carried out with the depth $X_1$ being in the range of about 0.01 to 0.1 μm.

At a second step, a quantity of P conductivity type impurity element is ion-implanted in the semi-conductor substrate at a position of depth $X_2$ which is deeper than the depth $X_1$, and then diffused so that a semiconductor layer is formed which has such an impurity concentration profile that the a maximum peak thereof occurs at the depth $X_2$. The P+ conductivity type semiconductor layer is formed in a shorter diffusion time than the N conductivity type semiconductor layer and in such a manner that the impurity concentration thereof is lower than the concentration of the N conductivity type impurity element at a respective depth $X_i$. However, the diffusion with respect to the P+ conductivity type semiconductor layer is effected so that at depth $X_3$, the impurity concentration turns out to be substantially equal or close to the concentration of the N conductivity type impurity element, as represented by the curve (b) in FIG. 3. This ion-implantation step is effected with the depth $X_2$ in the range of about 0.015 to 0.15 μm, for example. As a result of this step, inflection point T is formed at the depth $X_3$ close to the depth $X_2$.

Subsequent to the above-described first and second steps by which the N+ conductivity type semiconductor layer was formed as represented by the curves (1) and (2) in FIG. 3, a third step is performed whereby a quantity of P conductivity type impurity element is ion-implanted and then diffused in the N+ conductivity type semiconductor layer as represented by the curve (1) in FIG. 3, and thus a PN junction J is formed.

At a fourth step, the semiconductor substrate is subjected to removal of a film resulting from thermal oxidization, and then a conductor film is provided on the surface thereof. In this way, a variable-capacitance diode device is provided.

In the variable-capacitance diode device produced by the method of this invention, the N+ conductivity type semiconductor layer includes a region in which a maximum peak of the impurity concentration occurs at the depth $X_2$ as represented by the curve (4) in FIG. 3, and the impurity concentration profile of the N+ conductivity type semiconductor layer includes a region in which the following expression holds true:

$$A_i \leq A_{i+1} \ (i=1, 2, \ldots, n) \tag{3}$$

where $A_i$ is the impurity concentration at the depth $X_i$. It is possible that at lease one such a point that the above expression (3) holds true, may be formed, except for the PN junction J and in the vicinity of the substrate.

Obviously, it is also possible that the ion-implantation may be effected at different depths so that there occur a plurality of points where the above expression (3) holds true.

The process of forming the P+ conductivity type diffusion layer formed by the above-mentioned second and third steps, is not limited to ion-implantation process; obviously, such a diffusion layer can also be formed by means of deposition drive-in process.

Figure 1:
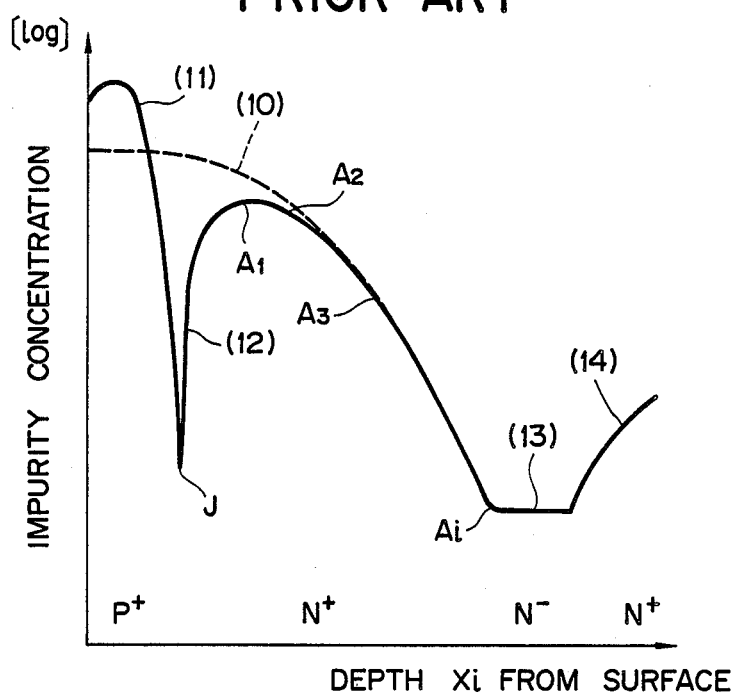
FIG. 1 illustrates an impurity concentration profile which results from the prior-art method of fabricating a variable capacitance diode device.
Figure 2:
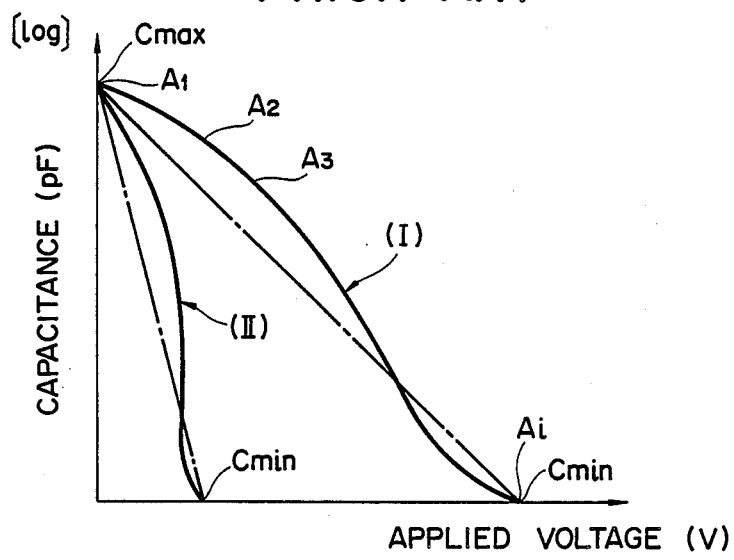
FIG. 2 is a view useful for explaining the relationship between depth $X_i$ in semiconductor substrate and impurity concentration.

In the variable-capacitance diode device fabricated by the aforementioned method of this invention, the PN junction J is defined in the vicinity of the depth $X_1$ by the P+ conductivity type semiconductor layer having such an impurity concentration profile as represented by the dotted line curve (3) in FIG. 3, and the N+ conductivity type semiconductor layer having such an impurity concentration profile as represented by the solid line curves (2) and (4) in FIG. 3. The N+ conductivity type semiconductor layer as represented by the curves (1) and (2) in FIG. 3 is formed so that inflection point T of the impurity concentration profile thereof occurs at the predetermined depth $X_3$. Referring to FIG. 2, with the prior-art construction, the impurity concentration profile tended to swell out in a region as indicated at $A_3$, and according to the present invention such tendency that the impurity concentration profile swells out in the region $A_3$, is eliminated by providing inflection point T where the donor concentration is reduced.

Description will next be made of the formation of the N+ conductivity type semiconductor layer having such impurity concentration profiles as represented by the curves (1) and (2) in FIG. 3.

There are provided impurity concentration profiles in which the P conductivity type impurity concentration is substantially equal or close to the N conductivity type impurity concentration. This can be achieved by controlling the energy of ion-implantation so that the P conductivity type and N conductivity type impurity concentrations become maximum at the depths $X_1$ and $X_2$ which are offset from each other, and by adjusting the diffusion time for each of the impurity elements. To achieve this, it is also possible that the P conductivity type and N conductivity type impurity elements having different diffusion coefficients may be combined so that the diffusion of the P conductivity type impurity element does not exceed the diffusion of the N conductivity type impurity element. For example, phosphorous or arsenic may be used as the N conductivity type impurity element, and boron as P conductivity type impurity element. Boron has a higher thermal diffusion coefficient than that of phosphorous and arsenic, and thus when these three impurity elements are used, such an impurity concentration profile as shown in FIG. 3 can be satisfactorily formed simply by effecting two diffusion steps. Arsenic can be most effectively used to form the variable-capacitance diode device of this invention since it has a lower diffusion coefficient than phosphorous and thus the concentration thereof can more readily be controlled.

In the method of manufacturing a variable-capacitance diode device according to the present invention, control is made such that the P conductivity type impurity concentration provided by the above-mentioned second step is lower than the N conductivity type impurity concentration provided by the above-mentioned first step, at any point in the direction of depth $X_i$ in FIG. 3, and the two impurity concentrations are substantially equal to each other, so that the N+ conductivity type and P+ conductivity type impurity charges are cancelled out each other at the depth $X_3$ as measured from the surface of the semiconductor substrate; thus the charges in the region at the depth $X_3$ are substantially equal to the charges that are intrinsically present in the semiconductor substrate.

Figure 4:
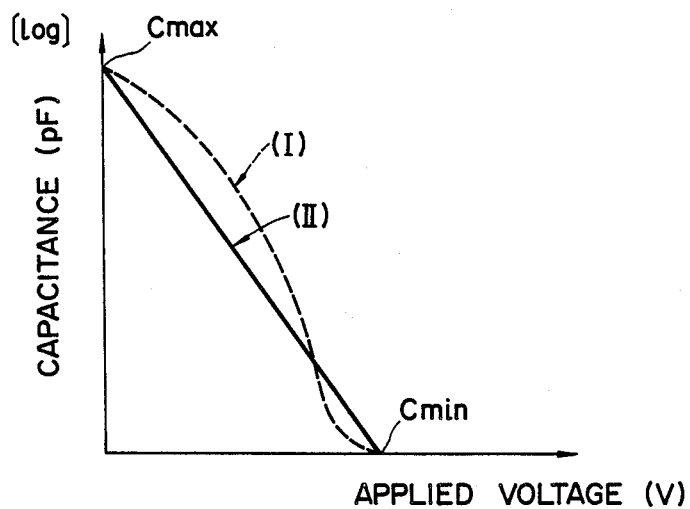
FIG. 4 is a view useful for explaining the relationship between applied voltage and capacitance in the device manufactured by the method of this invention.

As will be appreciated from the foregoing discussion, the method of this invention is advantageous in that it provides a variable-capacitance diode device in which a substantially linear relationship exists between applied voltage and capacitance a semi-logarithmic scale as shown at (II) in FIG. 4 so that sufficient tuning capacitance can be achieved even with application of as low a voltage as about 1 to 2 V, as opposed to the prior art with which the curve representing the relationship between applied voltage and capacitance swells out in the form of inverted S-shape as shown at (I) in FIG. 4.

Another advantage of the present method of a low concentration region can be very easily formed at a predetermined depth.

While the present invention has been illustrated and described with respect to specific embodiments thereof, it is to be understood that the present invention is by no means limited thereto but encompasses all changes and modifications which will become possible within the scope of the appended claims.

I claim:

1. A method of making a variable-compacitance diode device comprising the steps of:
    (1) forming semiconductor layer of the first conductivity type by introducing an impurity element of the first conductivity type in a semiconductor substrate with a high degree of concentration;
    (2) forming a semiconductor layer of a second conductivity type having such an impurity concentration profile that the concentration of impurity element of the second conductivity type is lower than the impurity concentration of said semiconductor layer of the first conductivity type formed in said semiconductor substrate; and at a predetermined depth, the concentration of the second conductivity type impurity element is substantially equal or close to the concentration of the first conductivity type impurity element; and (3) subsequent to said steps (1) and (2) by which the first conductivity type semiconductor layer was formed, introducing impurity element of the second conductivity type so as to define said PN junction with said first conductivity type semiconductor layer.

2. A method according to claim 1, wherein said semiconductor substrate is an $N^-$ conductivity type semiconductor substrate; said first conductivity type semiconductor layer is an $N^+$ conductivity type semiconductor layer; and said second conductivity type layer is a $P^+$ conductivity type semiconductor layer.

3. A method according to claim 2, wherein said $N^+$ conductivity type semiconductor layer is provided with such an impurity concentration profile that a maximum peak of the impurity concentration occurs at a depth $X_1$; said $P^+$ conductivity type semiconductor layer is provided with such an impurity concentration profile that a maximum peak of the impurity concentration occurs at a depth $X_2$; and said $N^+$ conductivity type and $P^+$ conductivity type semiconductor layers are formed by effecting ion-implantation steps at said depths $X_1$ and $X_2$ respectively.

4. A method according to claim 3, wherein said depth $X_1$ is in the range of about 0.01 to 0.1 $\mu$m, and said depth $X_2$ is in the range of about 0.015 to 0.15 $\mu$m.

5. A method according to claim 4, wherein said first conductivity type impurity element comprises phosphorous or or arsenic, and said second conductivity type impurity element comprises boron.

* * * * *